(12) United States Patent
Kim

(10) Patent No.: US 6,699,782 B2
(45) Date of Patent: Mar. 2, 2004

(54) METHOD OF FABRICATING A WAFER LEVEL PACKAGE

(75) Inventor: Jong Heon Kim, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 119 days.

(21) Appl. No.: 10/024,892

(22) Filed: Dec. 18, 2001

(65) Prior Publication Data

US 2003/0032276 A1 Feb. 13, 2003

(30) Foreign Application Priority Data

Aug. 7, 2001 (KR) ........................................ 2001-47459

(51) Int. Cl.⁷ ............................................... H01L 21/44
(52) U.S. Cl. ...................................... 438/614; 438/462
(58) Field of Search .................................. 438/462, 612, 438/614, 613, 584

(56) References Cited

U.S. PATENT DOCUMENTS

| 6,107,180 A | 8/2000 | Munroe et al. |
| 6,118,180 A | 9/2000 | Loo et al. |
| 6,153,503 A | 11/2000 | Lin et al. |
| 6,287,893 B1 * | 9/2001 | Elenius et al. ............... 438/108 |
| 6,413,868 B1 * | 7/2002 | Bartush et al. .............. 438/690 |
| 2002/0140069 A1 * | 10/2002 | Lee et al. .................... 257/678 |

FOREIGN PATENT DOCUMENTS

| JP | 0040624 | 2/1999 |

* cited by examiner

Primary Examiner—John F. Niebling
Assistant Examiner—Christopher Lattn
(74) Attorney, Agent, or Firm—Ladas & Parry

(57) ABSTRACT

A fabrication method of wafer level packages capable of improving reliability by maximizing a contact area of metal wiring and a conductive ball and of simplifying fabrication processes by reducing the number of sputtering. The disclosed method comprises the steps of: providing a substrate having a plurality of chip pads on the upper part thereof; forming a first insulating layer including a first opening exposing the chip pad and a second opening forming a ball land on the substrate; forming metal wiring connected to the chip pad in a single unit through the first opening and covering the second opening to have a ball land on the first insulating layer; forming a second insulating layer including a third opening which covers the metal wiring, however, exposes the ball land; and adhering a conductive ball to be in contact with the third opening on the ball land.

25 Claims, 9 Drawing Sheets

METHOD OF FABRICATING A WAFER LEVEL PACKAGE

BACKGROUND OF THE INVENTION

1. Field of the Invention

The present invention relates generally to a method of fabricating a semiconductor package, and more particularly to, a fabrication method for a wafer level package capable of simplifying package fabricating processes by reducing the number of metal sputtering processes for the formation of metal wiring and stably adhering a conductive ball by maximizing the contact area of conductive ball and metal wiring.

2. Description of the Related Art

As generally known, semiconductor devices, such as integrated circuits (IC), generally are mounted in a package. The package is formed by sawing IC chips, obtained by a layer growth process of a semiconductor wafer, from the wafer and then shielding and molding the separated IC chip for protection from external moisture and impurities. Leads are attached to the structure to connect with circuitry external to the package, thereby completing the package process.

Semiconductor packages are generally classified according to the method used in the leads and in the shield or molding structure. A wafer level package of the present invention has a molding structure wherein the IC chip is of a size that takes up most of space of the package. This type of wafer level package is employed in micro device to increase packaging density and the degree of integration.

FIGS. 1A to 1D illustrate the steps for fabrication in a conventional method for fabricating a wafer level package.

Referring to FIG. 1A, a first insulating layer 116 is deposited on a semiconductor substrate 100 and then, exposure and development processes are performed by photolithography to form a first opening 117 exposing a chip pad 112.

On the upper part of the semiconductor substrate 100, a plurality of such chip pads 112 are formed, separated from each other, and a protective layer 114 is formed between the chip pads 112.

Although it is not shown in drawings, a plurality of diffusion areas, gate electrodes, electrodes for the formation of capacity and metal wiring are connected to chip pads.

Referring to FIG. 1B, metal material, such as aluminum, is deposited on the first insulating layer 116 in accordance with a sputtering method and then pattern etched to cover the first opening 117 and be connected to chip pad 112, thereby obtaining metal wiring 118. The metal wiring 118 is connected to chip pad 112 and a predetermined part thereof is extended. On the extended part, a ball land (not shown) is formed by succeeding processes to provide a connection to which a conductive ball is later adhered.

Referring to FIG. 1C, a second insulating layer 120 is deposited on the first insulating layer 116 to cover the metal wiring 118. Then, the second insulating layer 120 is subjected to exposure and development processes by photolithography, thereby obtaining a second opening 121 to form the ball land.

Referring to FIG. 1D, a conductive ball 130, such as solder ball, is adhered to the metal wiring 118 at the second opening 121, thereby completing package fabrication.

However, there is a problem in that the contact area of the metal wiring and the conductive ball is small, since metal wiring under the conductive ball has a flat structure. Furthermore, when a thermal cycle is performed to test reliability of the package, splits are generated on the contact area of the conductive ball and the metal wiring due to thermal expansion. Here, as the contact area is increased, a higher energy level is required to generate such splits. Therefore, an extensive contact area has been found effective to prevent the generation of splits. As a result, the above-mentioned conventional method has a disadvantage of package reliability as a result of the contact area being small.

As a solution to these problems, a method has been proposed that the metal wiring have an uneven shape so as to increase the contact area of the metal wiring and the conductive ball.

FIGS. 2A to 2E are drawings for showing the steps for fabrication of a wafer level package according to another conventional method. Referring to FIG. 2A, a first insulating layer 216 is deposited on a semiconductor substrate 200 and then pattern etching is performed to expose a chip pad 212, thereby forming a first opening 217. In the drawing, reference code 214 indicates a protective layer.

The semiconductor substrate 200 may be the same as semiconductor substrate 100 of the above-mentioned conventional method.

Referring to FIG. 2B, a metal layer is deposited on the first insulating layer 216 by sputtering aluminum and then pattern etching is performed to cover the first opening 217, thereby forming a first metal wiring 218.

Next, referring to FIG. 2C, a second insulating layer 220 is deposited on the first insulating layer 216 so as to cover the first metal wiring 218. Then, a predetermined part of the second insulating layer 220 is etched to form a second opening 221 for the formation of a ball land.

Referring to FIG. 2D, a second metal wiring 222 is formed on the second insulating layer 220 by sputtering aluminum and then performing an etching process to cover the second opening 221. The second metal wiring 222 is connected to the chip pad 212 through the first metal wiring 218.

Finally, referring to FIG. 2E, a conductive ball 230 is adhered on the second metal wiring 222, thereby completing package fabrication.

However, according to the above method, sputtering processes are required to be performed twice and, as a result, package fabrication processes become complicated because of the need to transfer into another chamber for another metal formation.

SUMMARY OF THE INVENTION

Therefore, the present invention has been made to solve the above-mentioned problems. One object of the present invention is to provide a fabrication method for a wafer level package capable of increasing reliability by maximizing the contact area of a conductive ball and of the metal wiring.

Another object of the present invention is to provide a fabrication method of wafer level package capable of simplifying the fabrication steps and processes by performing a metal sputtering process only once. In order to accomplish the above objects, the present invention comprises the steps of: providing a substrate having a plurality of chip pads on the upper part thereof; forming a first insulating layer having a first opening exposing chip pads and a second opening forming a ball land on the substrate; forming a metal wiring connected to the chip pad through the first opening and covering the second opening to provide a ball land on the first insulating layer; forming a second insulating layer having a third opening which covers the metal wiring, except for the third opening so as to expose the ball land; and adhering a conductive ball to the metal wiring exposed by the third opening, the conductive ball being in contact with the sides of the third opening.

According to the present invention, a second embodiment comprises the steps of: providing a substrate having a plurality of chip pads on the upper part thereof; forming a first insulating layer having a first opening thereon to expose the chip pad on the substrate; performing an etching process by irradiating laser energy on a predetermined part of the first insulating layer to form a second opening for the formation of a ball land; forming metal wiring connected to the chip pad through the first opening on the first insulating layer and covering the second opening to provide a ball land; forming a second insulating layer having a third opening which covers the metal wiring, except for the third opening so as to expose the ball land; and adhering a conductive ball to the metal wiring exposed by the third opening, the conductive ball being in contact with the sides of the third opening.

According to the present invention, a third embodiment comprises the steps of: providing a substrate having a plurality of chip pads on the upper part thereof; forming a first insulating layer to cover the chip pad on the substrate; performing an etching process by a first ultraviolet irradiation on the first insulating layer to form a first opening exposing the chip pad; performing an etching process by a second ultraviolet irradiation on a predetermined part of the first insulating layer to form a second opening for the formation of a ball land; forming metal wiring connected to the chip pad through the first opening and covering the second opening to provide a ball land on the first insulating layer; forming a second insulating layer having a third opening which covers the metal wiring, except for the third opening so as to expose the ball land; and adhering a conductive ball to the metal wiring exposed by the third opening, the conductive ball being in contact with the sides of the third opening.

DETAILED DESCRIPTION OF THE INVENTION

The above objects, and other features and advantages of the present invention will become more apparent after reading the following detailed description when taken in conjunction with the attached drawings.

FIGS. 3A to 3E illustrate the steps of a fabrication process for making a wafer level package according to an embodiment of the present invention.

Figure 1A:
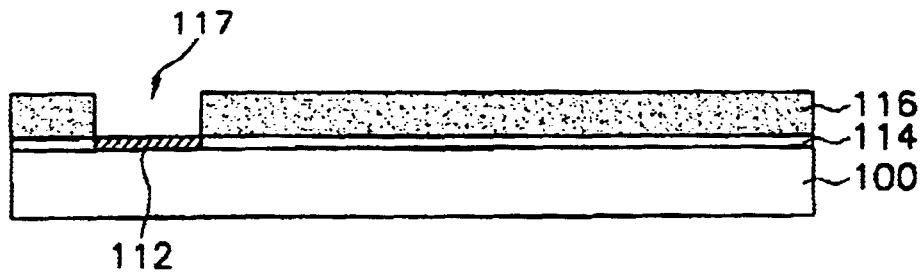
FIGS. 1A to 1D illustrate the steps of a conventional fabrication method for making a wafer level package.
Figure 1B:
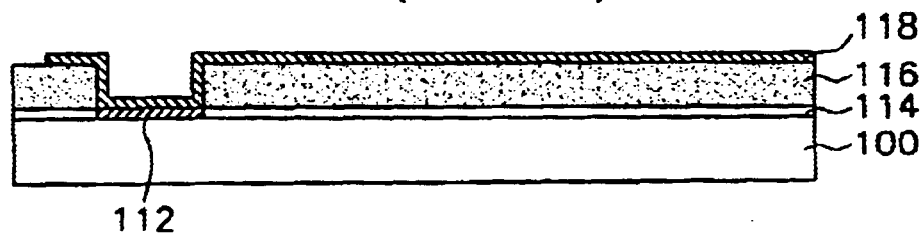
Figure 1C:
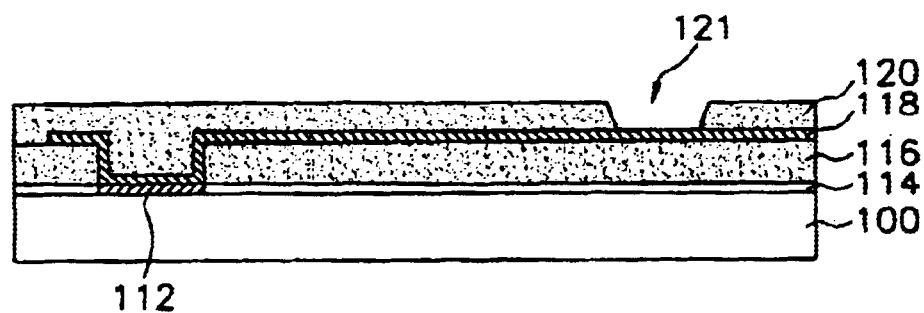
Figure 1D:
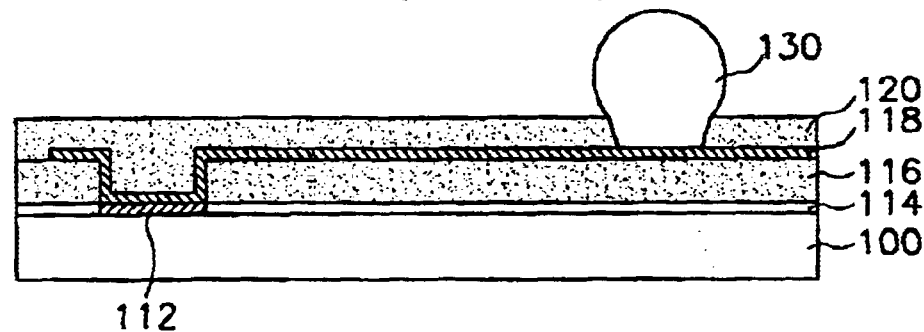
Figure 2A:
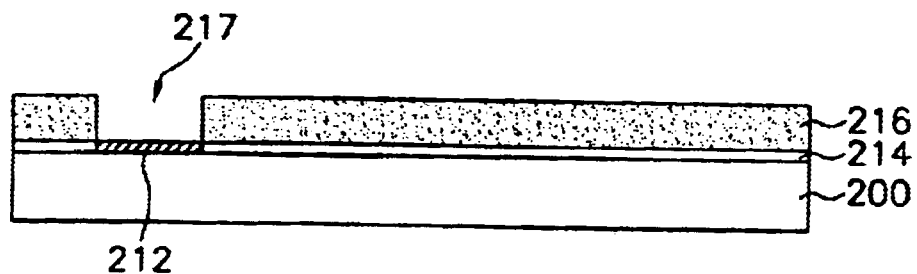
FIGS. 2A to 2E illustrate the steps of a conventional fabrication method for making a wafer level package.
Figure 2B:
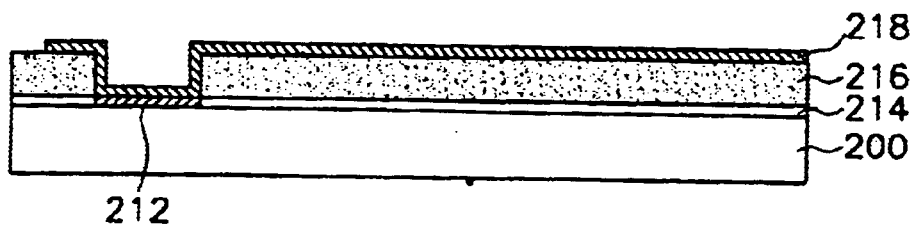
Figure 2C:
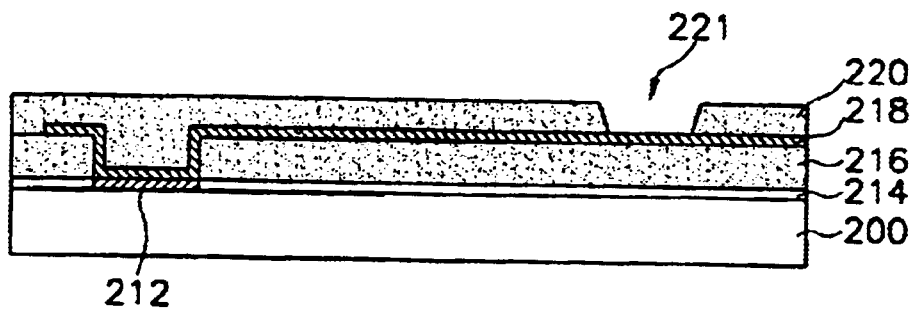
Figure 2D:
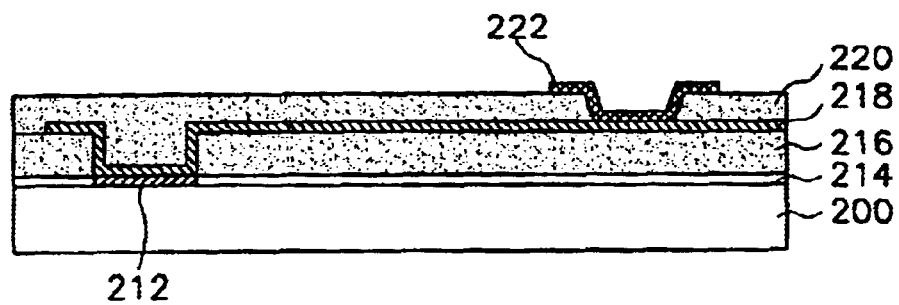
Figure 2E:
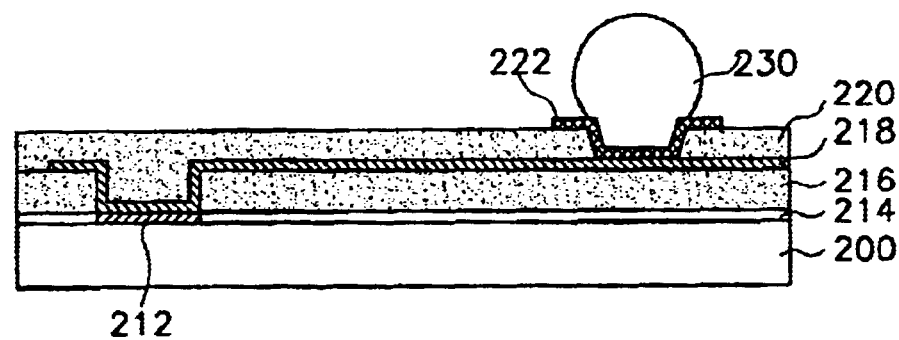
Figure 3A:
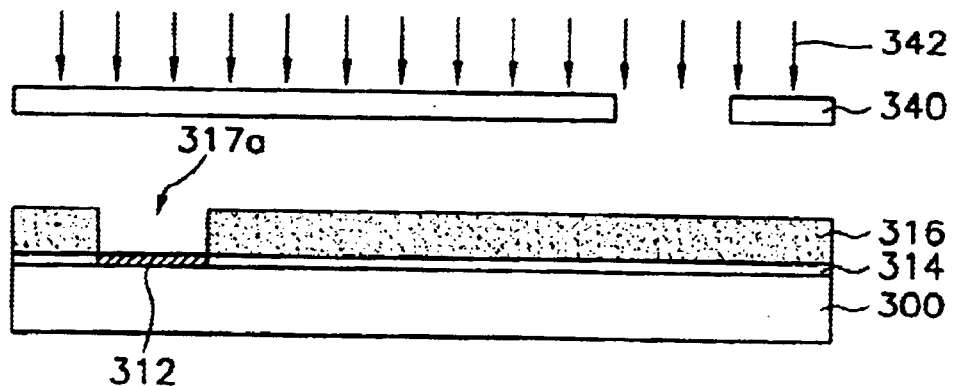
FIGS. 3A to 3E illustrate the steps of a fabrication method for making a wafer level package according to an embodiment of the present invention.

Referring to FIG. 3A, a first insulating layer 316 is formed on a substrate 300. The first insulating layer 316 is made with polyimide in liquid form or in solid form and employed as an insulating layer for buffering stress with the substrate 300. Here, the identification numeral 314 indicates a protective layer around chip pads 312.

Then, a sensitive film pattern (not shown) is formed to expose a region corresponding to an IC chip pad on the first insulating layer 316. And, the first insulating layer 316 is selectively removed using the sensitive layer as a mask, thereby forming a first opening 317a exposing the chip pad 312.

Subsequently, the sensitive film pattern is removed, thereby forming a mask 340 exposing a predetermined part of the first insulating layer 316. Then, the first insulating layer 316 is subjected to laser irradiation using the mask 340 wherein the range of laser energy is 0.1 to 2 Joules.

Figure 3B:
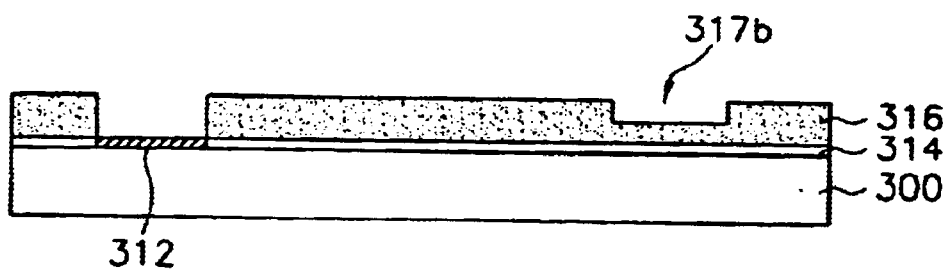

Referring to FIG. 3B, a second opening 317b is formed on the first insulating layer 316 by laser irradiation, the opening 317b having a groove shape, after which the mask is removed. The second opening 317b provides a region to form a ball land in the following processes.

In the above steps, the first opening 317a is formed in accordance with a photolithography process. However, it may be formed in accordance with a laser irradiation process employed to form the second opening 317b. That is, the first opening 317a and the second opening 317b may be formed by irradiating different amounts of laser energy, which may be obtained by controlling the irradiation time in the same energy range.

Figure 3C:
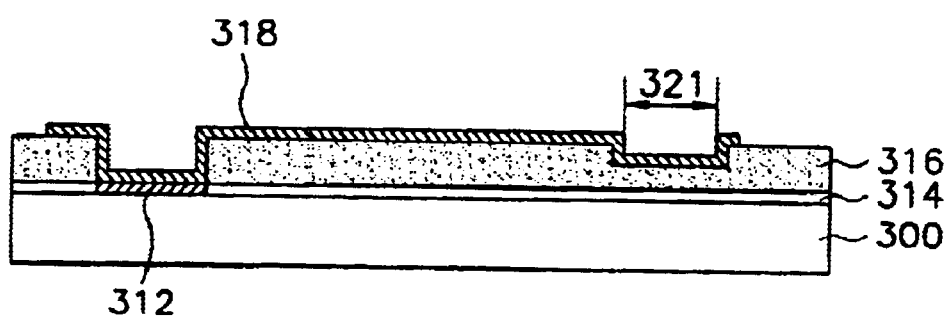

Referring to FIG. 3C, a metal layer is deposited on the first insulating layer 316 by sputtering metal, such as aluminum, and then the metal layer is subjected to a pattern etch process to remove the metal layer from the first insulating layer 316 except for the strips covering the first opening 317a and the second opening 317b, thereby forming metal wiring 318.

The metal wiring 318 is connected to the chip pad 312 in a single unit through the first opening 317a and the part corresponding to the second opening 317a comprises a ball land 321, wherein a conductive ball is adhered in a subsequent fabrication step.

Figure 3D:
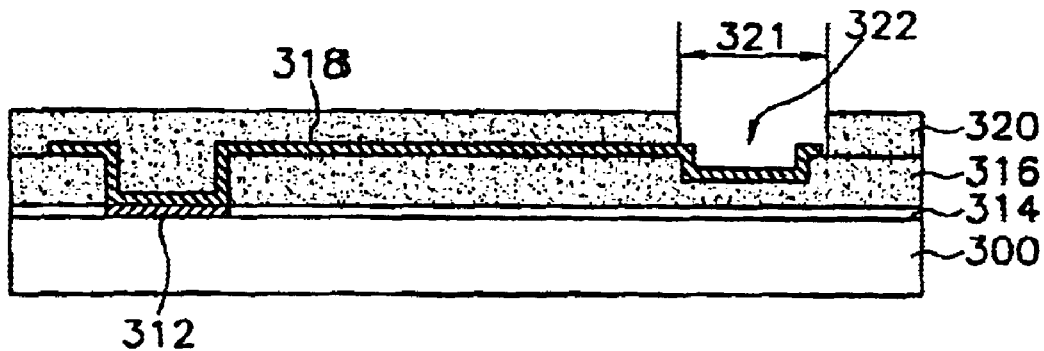

Referring to FIG. 3D, a second insulating layer 320 is formed to cover the metal wiring 318 and the first insulating layer 316. The second insulating layer 320 may comprise the same materials as that of the first insulating layer 316.

Then, a pattern etching process is performed to expose a predetermined part of the second insulating layer 320, thereby forming a third opening 322, thereby exposing a ball land 321 of the metal wiring 318.

The third opening 322 has a width wider than that of the second opening 317b, and is desirably the same width as that of conductive ball to be adhered to the land 321.

The metal wiring 318 exposed by the third opening 322 is employed as a ball land wherein the conductive ball is to be adhered in a subsequent step. The second insulating layer 320 may comprise a polyimide in liquid or solid form to protect the metal wiring 318.

Figure 3E:
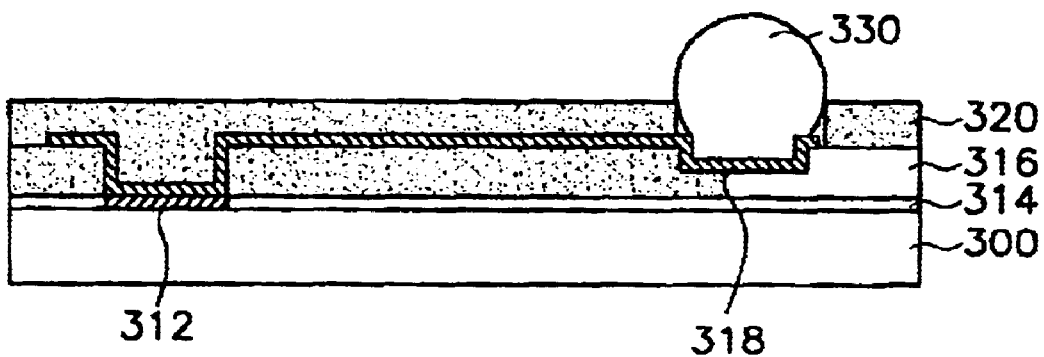

Referring to FIG. 3E, a conductive ball 330 such as solder ball is adhered on the metal wiring of land 321 within the third opening 322. The conductive ball 330 is in contact with the ball land 321 of the metal wiring 318 and with the metal wiring disposed at the sides of the third opening 322 of the second insulating layer 320, thereby obtaining added stability in adherence.

As described above, according to this embodiment of the present invention, a second opening is formed having an uneven shape to define a ball land region by laser exposure on the first insulating layer and then, a metal wiring is formed thereon, thereby increasing the contact area between the metal wiring and the conductive ball. A metal sputtering process for forming the metal wiring is performed only once, thereby simplifying the fabrication processes of the inventive wafer level package.

FIGS. 4A to 4F illustrate the steps of a fabrication process for making a wafer level package according to another embodiment of the present invention.

Figure 4A:
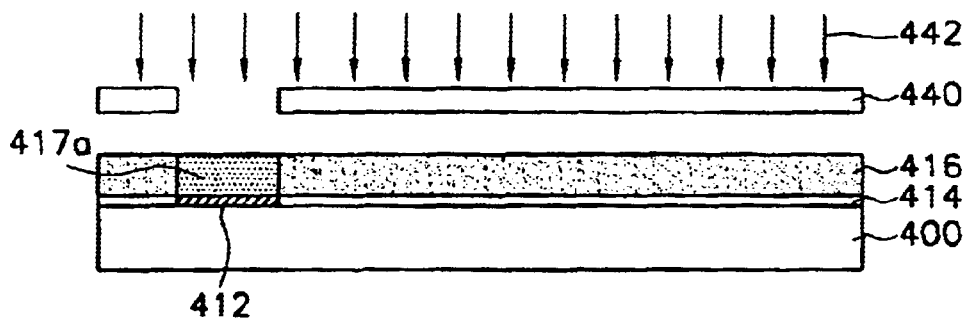
FIGS. 4A to 4F illustrate the steps of a fabrication method for making a wafer level package according to another embodiment of the present invention.

Referring to FIG. 4A, a first insulating layer 416 for buffering stress is formed on a substrate 400 to buffer stress with the substrate. Then, a first mask 440 is formed to expose a part corresponding to a chip pad 412 on the first insulating layer 416 and a first ultraviolet irradiation, shown by arrows 442, is performed by using the mask.

The first ultraviolet irradiation 442 is performed in an energy range of from 500 to 3000 mJ/cm$^2$, which is irradiated until it reaches the bottom of the first insulating layer 416. The identification numeral 417a indicates a part of the first insulating layer 416 whereon the first ultraviolet irradiation is performed.

Figure 4B:
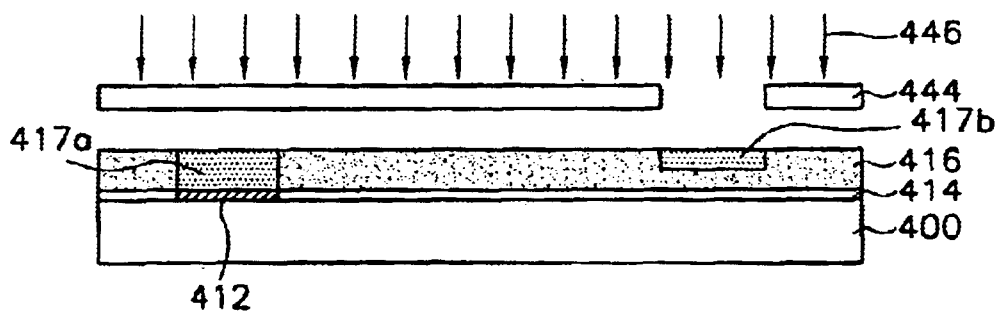

Subsequently, as shown in FIG. 4B, the first mask is removed and a second mask is formed to expose a different predetermined part of the first insulating layer 416 from where the first ultraviolet irradiation is performed. A second ultraviolet irradiation, shown by arrows 446, is performed on the first insulating layer 416 to a predetermined depth by using the second mask. The second ultraviolet irradiation 446 is performed in an energy range of 100 to 2000 mJ/cm$^2$.

Figure 4C:
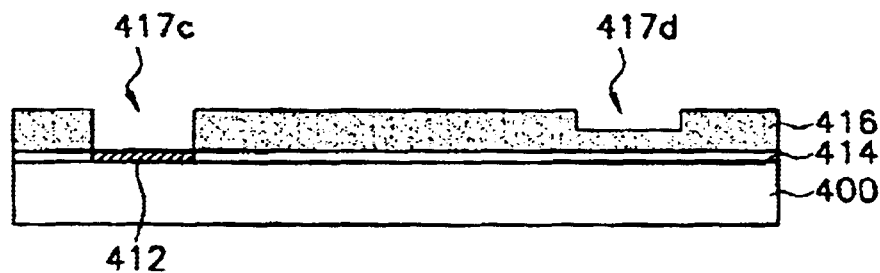

The identification numeral 417b indicates a part of the first insulating layer 416 whereon the second ultraviolet irradiation is performed. Then, as shown in FIG. 4C, the second mask is removed.

Thereafter, a first opening 417c and a second opening 417d are formed by developing the first insulating layer 416 whereon the first and the second ultraviolet irradiation is performed. The second opening 417d is a ball land region to be formed in a succeeding process step.

Figure 4D:
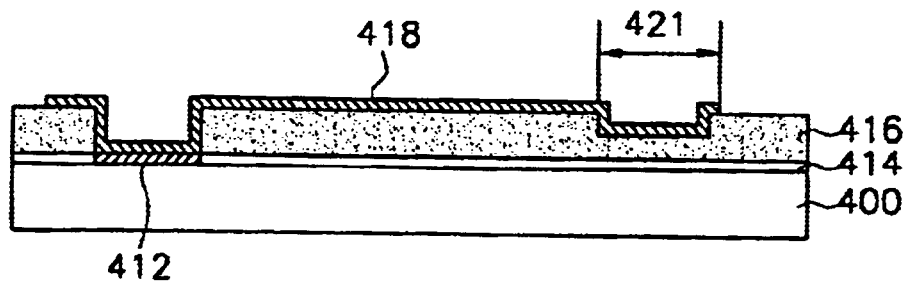

Referring to FIG. 4D, metal wiring 418 is formed by sputtering metal on the first insulating layer 416 and then by performing pattern etching to remove the metal layer so as to cover the first opening and the second opening.

The metal wiring 418 is connected to the chip pad 412 in a single unit through the first opening 417c in the first insulating layer 416 and a part corresponding to the second opening 417d is employed as a ball land 421 whereon a conductive ball is to be adhered in a subsequent step.

Figure 4E:
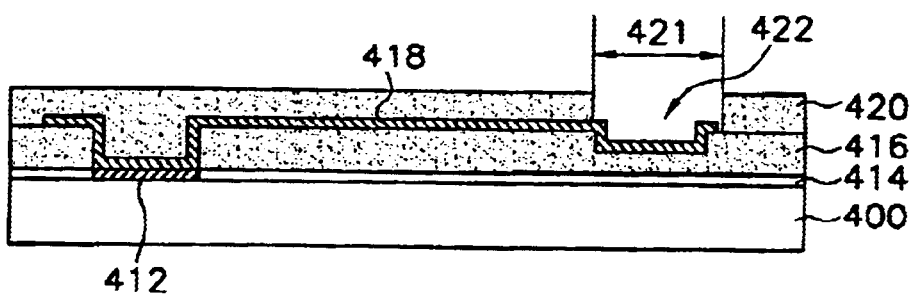

Referring to FIG. 4E, a second insulating layer 420 is formed on the first insulating layer 416 and on the metal wiring 418. The second insulating layer 420 is employed to protect the metal wiring 418. Then, the first insulating layer 420 is etched, thereby forming a third opening 422, to expose the ball land 421. The third opening 422 has a width wider than that of the second opening 417d, and is desirably the same width as that of conductive ball.

Figure 4F:
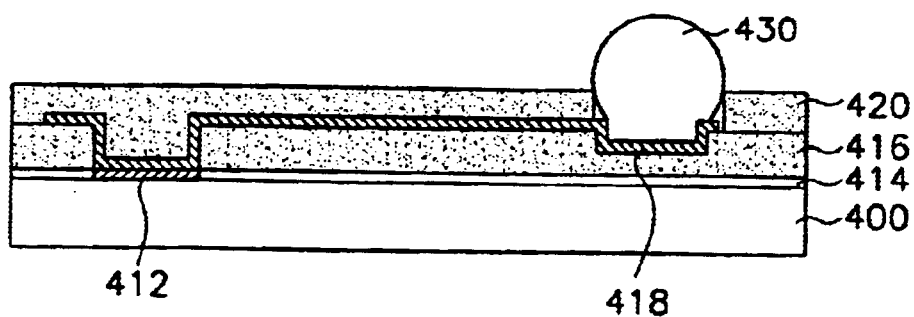

The first and the second insulating layers 416, 420 preferably comprise a polyimide in liquid or solid form. Referring to FIG. 4F, a conductive ball 430 is adhered on the land 421 within the third opening 422. The bottom of the conductive ball 430 is adhered to the ball land 421 of the metal wiring 418 and the side of the conductive ball is adhered to the metal wiring disposed at the sides of the third opening 422, thereby obtaining stability in adherence. The metal wiring on the sides of the third opening 422 of the second insulating layer 420 supports the conductive ball 430 in the ball land so as to provide further stability.

As described above, according to this second embodiment of the present invention, the first and the second openings are formed in uneven shapes and to differing depths by exposing the first insulating layer with different ultraviolet energy and the metal wiring is formed over both openings, thereby increasing the contact area between the metal wiring and the conductive ball. A metal sputtering process for forming the metal wiring is performed only once to form the metal wiring, thereby simplifying the fabrication process of the wafer level package.

FIGS. 5A to 5E illustrate the steps of a fabrication process for making a wafer level chip scale package according to still another embodiment of the present invention.

Figure 5A:
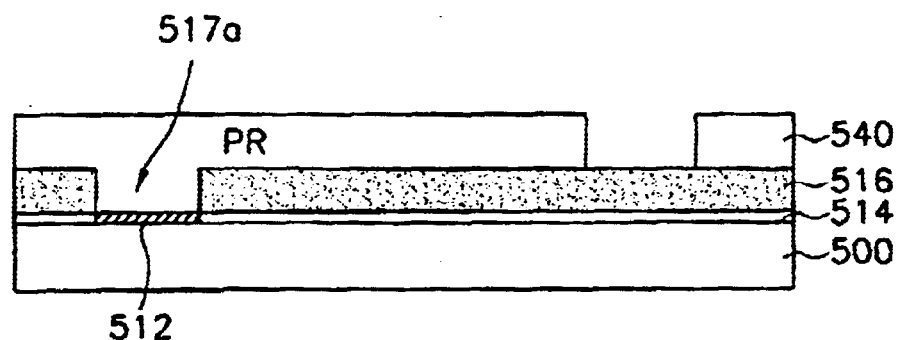
FIGS. 5A to 5E illustrate the steps of a fabrication method for making a wafer level package according to still another embodiment of the present invention.

Referring to FIG. 5A, a first insulating layer 516 is formed on a substrate 500. Then, a first opening 517a is formed by etching the first insulating layer 516 to expose a chip pad 512. The formation processes of the first insulating layer 516 and the first opening 517a are the same as that of the above-described embodiments of the present invention. Identification numeral 514 indicates a protective layer around the chip pads 512.

A sensitive film pattern 540 is formed to expose a predetermined part of the insulating layer by applying a sensitive film on the first insulating layer 516 and performing exposure and development.

Figure 5B:
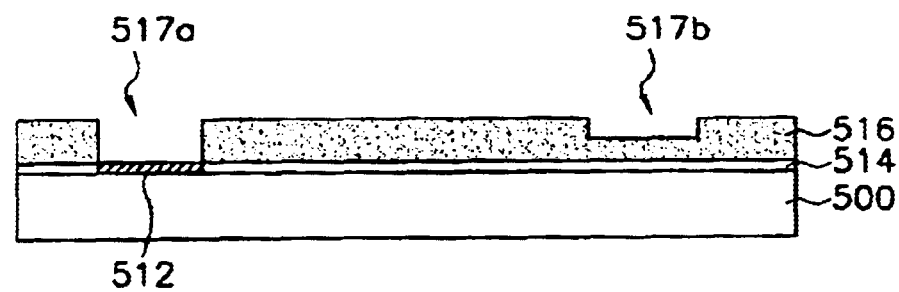
Figure 5C:
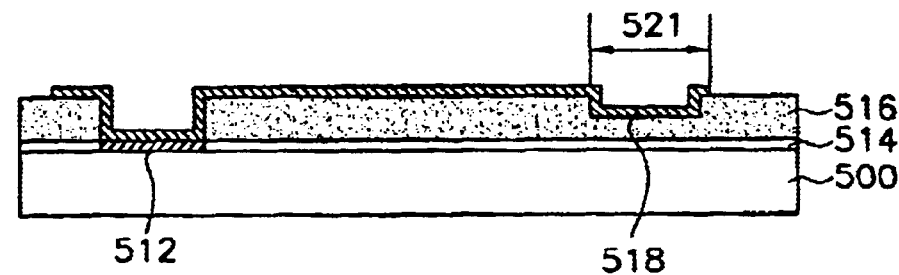

Referring to FIG. 5B, a second opening 517b is formed by etching the first insulating layer 516 using the sensitive film pattern as an etching mask. The second opening 517b comprises a ball land region to be formed in a succeeding process step. Then, the sensitive film pattern is removed as shown in FIG. 5C.

Subsequently, metal wiring 518 is formed by sputtering aluminum on the first insulating layer 516 and performing pattern etching so as to cover the first and the second openings.

The metal wiring 518 is connected to the chip pad 512 in a single unit through the first opening and a part corresponding to the second opening is to later comprise a ball land 521 in a succeeding process step.

Figure 5D:
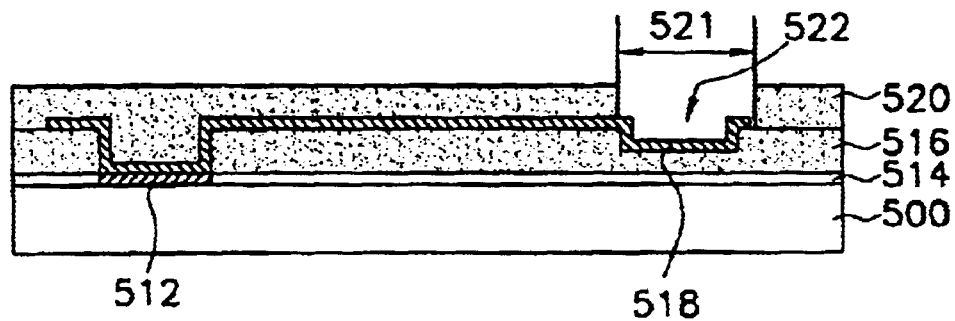

Referring to FIG. 5D, a second insulating layer 520 for protection of metal wiring is formed on the first insulating layer 516 and also covers the metal wiring 518. Then, a third opening 522 is formed by etching the second insulating layer 520 to expose the ball land 521 of the metal wiring 518. The third opening 522 has a width wider than that of the second opening 517b, and desirably is of the same width as that of the conductive ball.

The first and the second insulating layers 516, 520 preferably comprise a polyimide of liquid or solid form.

Figure 5E:
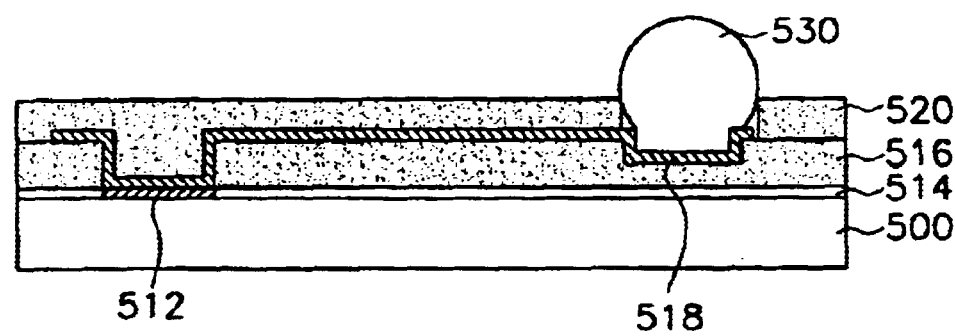

Referring to FIG. 5E, a conductive ball 530 is adhered to the metal wiring 518 of the land 521 within the third opening 522. The conductive ball 530 is in contact with surface of the ball land 521 of metal wiring 518 and is also in contact with the metal wiring 518 of the sides of the third opening 522, thereby increasing stability in adherence.

As described above, according to this third embodiment of the present invention, the first and the second openings are formed in uneven shapes to different depths by exposing the first insulating layer with different degrees of exposure by using the sensitive film pattern as a mask. Metal wiring is formed to cover the first and the second openings, thereby increasing the contact area between the metal wiring and the conductive ball. Similar to prior embodiments, a metal sputtering process for forming the metal wiring is performed only once to form metal wiring, thereby simplifying the fabrication process of the wafer level package The present invention provides for first and second openings formed in uneven shapes by performing exposure processes on the first insulating layer with different degrees and metal wiring formed over the openings, thereby producing the advantage of increasing the contact area between metal wiring and conductive ball.

Furthermore, adherence of the conductive ball to the ball land comprised by the metal wiring within the third opening of the second insulating layer is more stable, since the conductive ball land adheres to the metal wiring disposed on the sides of the opening.

Moreover, the fabrication process of the wafer level package is simplified, since a metal sputtering process is performed only once to form metal wiring.

The invention may be embodied in other specific forms without departing from the spirit or essential characteristics thereof. The present embodiment is therefore to be considered in all respects as illustrative and not restrictive. Any changes that come within the meaning and range of equivalency of the claims are therefore intended to be embraced by the following claims and equivalents thereof.

What is claimed is:

1. A fabrication method of a wafer level package comprising the steps of:
    providing a substrate having a plurality of chip pads on the upper part thereof;
    forming a first insulating layer including a first opening exposing the chip pad and a second opening forming a ball land on the substrate;
    forming a metal wiring connected to the chip pad in a single unit through the first opening and covering the second opening to provide a ball land on the first insulating layer;
    forming a second insulating layer including a third opening which covers the metal wiring, except for the third opening, which exposes the metal wiring and defining the ball land; and
    adhering a conductive ball to the metal wiring exposed by the third opening, the conductive ball being in contact with the defining ball land exposed by third opening, wherein the first and second openings are formed by exposing the first insulating layer and conducting irradiation in different degrees.

2. The fabrication method of a wafer level package according to claim 1, wherein the first and second insulating layers comprise a polyimide in liquid or solid form.

3. The fabrication method of a wafer level package according to claim 1, wherein the third opening has a width that is essentially the same as the width of the conductive ball.

4. The fabrication method of a wafer level package according to claim 1, wherein the first opening is formed by performing an etching process using photolithography on the first insulating layer.

5. The fabrication method of a wafer level package according to claim 1, wherein the second opening is formed by performing an etching process using laser irradiation on the first insulating layer.

6. The fabrication method of a wafer level package according to claim 5, wherein the irradiated laser energy is in the range of from 0.1 to 2.0 Joule/cm$^2$.

7. The fabrication method of a wafer level package according to claim 1, wherein the second opening is formed by performing an etching process using ultraviolet irradiation on the first insulating layer.

8. The fabrication method of a wafer level package according to claim 7, wherein the irradiated ultraviolet energy is in the range of from 100 to 300 mJ/cm$^2$.

9. The fabrication method of a wafer level package according to claim 1, wherein the second opening is formed by performing an etching process using photolithography on the first insulating layer.

10. The fabrication method of a wafer level package according to claim 1, wherein the first and second insulating layers comprise a polyimide in liquid or solid form.

11. The fabrication method of wafer level package comprising the steps of:
    providing a substrate having a plurality of chip pads on the upper part thereof;
    forming a first insulating layer, including a first opening exposing the chip pad on the substrate;
    forming a second opening for the formation of a ball land by performing an etching process using laser irradiation on a predetermined part of the first insulating layer;
    forming metal wiring connected to the chip pad in a single unit through the first opening and covering the second opening to provide a ball land on the first insulating layer;
    forming a second insulating layer having a third opening which covers the metal wiring, except for the third opening so as to expose the ball land; and
    adhering a conductive ball to the metal wiring exposed by the third opening, the conductive ball being in contact with the sides of the third opening, wherein the first and second openings are formed by exposing the first insulating layer and conducting irradiation in different degrees.

12. The fabrication method of a wafer level package according to claim 11, wherein the first opening is formed by performing an etching process using photolithography on the first insulating layer.

13. The fabrication method of a wafer level package according to claim 11, wherein the first opening is formed by performing an etching process using laser irradiation on the first insulating layer.

14. The fabrication method of a wafer level package according to claim 11, wherein the irradiated laser irradiation is in the range of from 0.1 to 2.0 Joule/cm$^2$.

15. The fabrication method of a wafer level package according to claim 11, wherein the third opening has a width wider than that of the second opening.

16. The fabrication method of a wafer level package according to claim 11, wherein the third opening has a width similar to the width of the conductive ball.

17. The fabrication method of a wafer level package according to claim 11, wherein the first and second insulating layers comprise a polyimide in liquid or solid form.

18. The fabrication method of a wafer level package comprising the steps of:
    providing a substrate having a plurality of chip pads on the upper part thereof;
    forming a first insulating layer to cover the chip pad on the substrate;
    forming a first opening exposing the chip pad by performing an etching process using a first ultraviolet irradiation on the first insulating layer;
    forming a second opening for the formation of a ball land by performing an etching process using a second ultraviolet irradiation on a predetermined part of the first insulating layer;

forming metal wiring connected to the chip pad in a single unit through the first opening and covering the second opening to provide a ball land on the first insulating layer;

forming a second insulating layer having a third opening which covers the metal wiring, except for the third opening so as to expose the ball land; and adhering a conductive ball to the metal wiring exposed by the third opening, the conductive ball being in contact with the sides of the third opening, wherein the first and second openings are formed by exposing the first insulating layer and conducting irradiation in different degrees.

19. The fabrication method of a wafer level package according to claim 18, wherein the first and the second ultraviolet irradiation are each performed at different energy values.

20. The fabrication method of a wafer level package according to claim 18, wherein the first ultraviolet irradiation is performed in the energy range of from 50 to 3000 J/cm$^2$.

21. The fabrication method of a wafer level package according to claim 18, wherein the second ultraviolet irradiation is performed in the energy range of from 10 to 2000 mJ/cm$^2$.

22. The fabrication method of a wafer level package according to claim 18, wherein the third opening has a width wider than that of the second opening.

23. The fabrication method of a wafer level package according to claim 18, wherein the second opening has a width similar to the width of the conductive ball.

24. The fabrication method of a wafer level package according to claim 18, wherein the first and the second insulating layers comprise a polyimide in liquid or solid form.

25. The fabrication method of a wafer level package according to claim 18, wherein the first and the second ultraviolet irradiation are each performed for different periods of time.

* * * * *